(12) United States Patent
Kitamura

(10) Patent No.: US 12,388,002 B2
(45) Date of Patent: Aug. 12, 2025

(54) SEMICONDUCTOR DEVICE

(71) Applicant: Kioxia Corporation, Tokyo (JP)

(72) Inventor: Masayuki Kitamura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 676 days.

(21) Appl. No.: 17/682,829

(22) Filed: Feb. 28, 2022

(65) Prior Publication Data

US 2023/0085314 A1    Mar. 16, 2023

(30) Foreign Application Priority Data

Sep. 15, 2021    (JP) ................. 2021-150516

(51) Int. Cl.
*H01L 23/498*    (2006.01)
*H01L 23/50*    (2006.01)
*H01L 25/065*    (2023.01)

(52) U.S. Cl.
CPC ........ *H01L 23/49838* (2013.01); *H01L 23/50* (2013.01); *H01L 25/0657* (2013.01); *H01L 2225/0651* (2013.01); *H01L 2225/06531* (2013.01); *H01L 2225/06562* (2013.01); *H01L 2225/06586* (2013.01)

(58) Field of Classification Search
CPC ....... H01L 23/49838–49844; H01L 24/20–25; H01L 23/13; H01L 23/50; H01L 23/5222; H01L 23/5227; H01L 23/5228; H01L 23/528–5286; H01L 23/5386; H10K 59/131–1315
See application file for complete search history.

(56) References Cited

U.S. PATENT DOCUMENTS

| | | |
|---|---|---|
| 8,786,099 B2 | 7/2014 | Fujii |
| 8,836,138 B2 | 9/2014 | Fujii |
| 2005/0017360 A1* | 1/2005 | Hirano ................ H01L 23/5225 257/E23.144 |
| 2016/0085899 A1 | 3/2016 | Qian et al. |

(Continued)

FOREIGN PATENT DOCUMENTS

| | | | |
|---|---|---|---|
| JP | 2001-144440 A | 5/2001 | |
| JP | 2008-235293 A | 10/2008 | |

(Continued)

OTHER PUBLICATIONS

Machine translation of TW201906123A (Year: 2019).*

*Primary Examiner* — Zandra V Smith
*Assistant Examiner* — Corbyn D Mellinger
(74) *Attorney, Agent, or Firm* — Foley & Lardner LLP

(57) ABSTRACT

A semiconductor device includes a substrate comprising a first interconnection configured to provide a first reference voltage, a second interconnection configured to provide a second reference voltage different from the first reference voltage, and at least one interconnection layer. The first interconnection comprises a plurality of first interconnection components that are provided in the interconnection layer. The second interconnection comprises a plurality of second interconnection components that are provided in the interconnection layer. The plurality of first interconnection components and the plurality of second interconnection components are alternately arranged in a first direction parallel to the interconnection layer.

14 Claims, 9 Drawing Sheets

(56) References Cited

U.S. PATENT DOCUMENTS

| | | |
|---|---|---|
| 2019/0229088 A1 | 7/2019 | Oikawa |
| 2021/0118800 A1* | 4/2021 | Jung .................... H01L 23/5286 |
| 2021/0296235 A1* | 9/2021 | Hsu ..................... H01L 23/5286 |

FOREIGN PATENT DOCUMENTS

| | | | | |
|---|---|---|---|---|
| JP | 2008-235364 A | | 10/2008 | |
| JP | 2010-153520 A | | 7/2010 | |
| TW | 201618232 A | | 5/2016 | |
| TW | 201906123 | * | 6/2017 | ........... H01L 23/538 |
| TW | 201906123 A | | 2/2019 | |

* cited by examiner

SEMICONDUCTOR DEVICE

CROSS-REFERENCE TO RELATED APPLICATION(S)

This application is based upon and claims the benefit of priority from Japanese Patent Application No. 2021-150516, filed Sep. 15, 2021, the entire contents of which are incorporated herein by reference.

FIELD

Embodiments described herein relate generally to a semiconductor device.

BACKGROUND

It is desirable to curb the influence of noise of a power supply voltage supplied to a semiconductor chip by lowering the impedance of a feed system interconnection, for example, in a wiring substrate of a semiconductor package.

DETAILED DESCRIPTION

Embodiments provide a semiconductor device that can decrease the impedance of a feed system interconnection.

In general, according to one embodiment, a semiconductor device includes a substrate comprising a first interconnection configured to provide a first reference voltage, a second interconnection configured to provide a second reference voltage different from the first reference voltage, and at least one interconnection layer. The first interconnection comprises a plurality of first interconnection components that are provided in the interconnection layer. The second interconnection comprises a plurality of second interconnection components that are provided in the interconnection layer. The plurality of first interconnection components and the plurality of second interconnection components are alternately arranged in a first direction parallel to the interconnection layer.

Hereinafter, embodiments will be described with reference to the drawings. The embodiments are not intended for limitation. The drawings are schematic or conceptual drawings and the ratio between the portions, for example, is not always identical to the actual ratio. In the specification and drawings, any element which is similar to that described in connection with the already explained drawing is denoted by the same reference sign and detailed explanations thereof are omitted as appropriate.

First Embodiment

Figure 1:
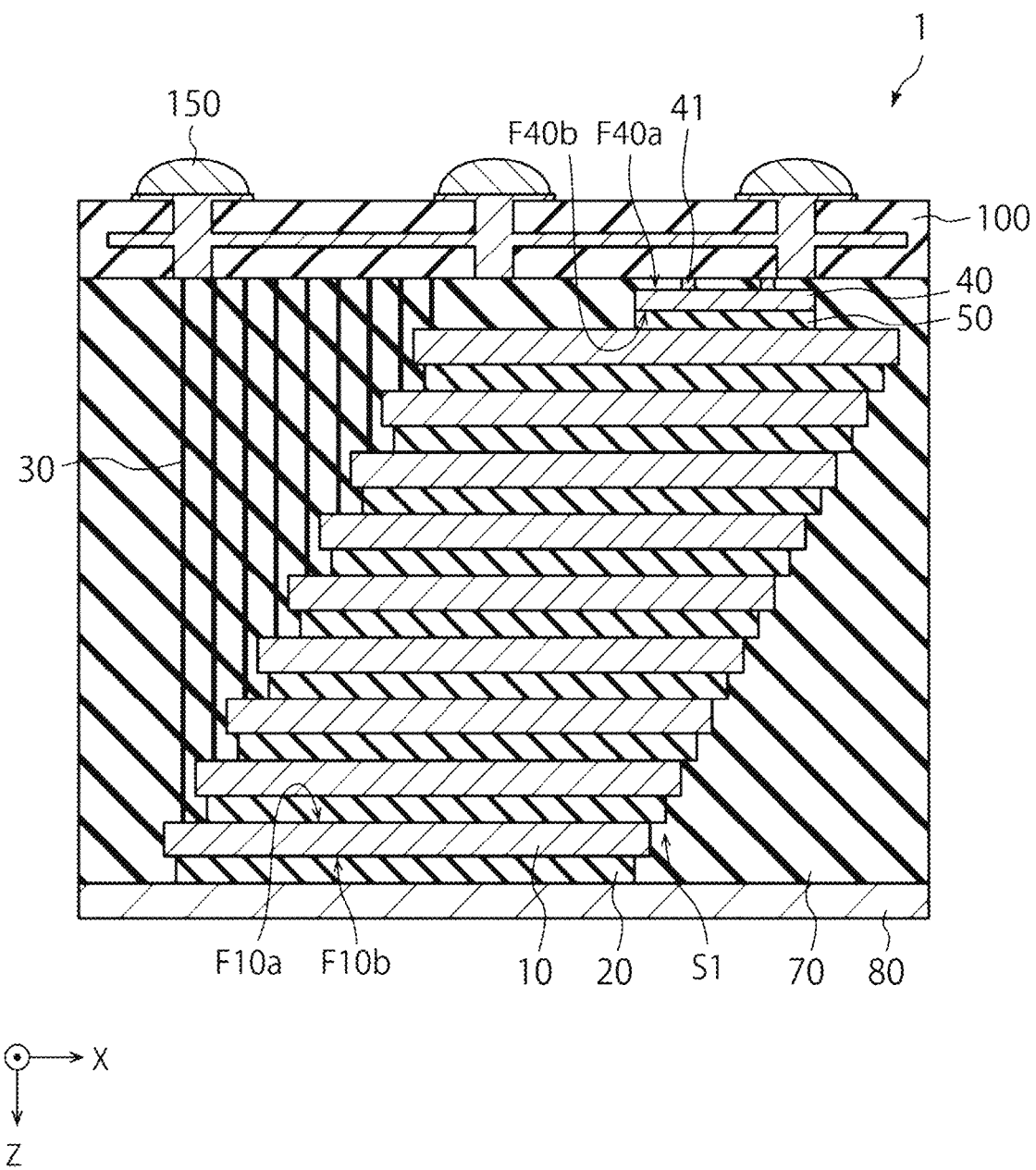
FIG. 1 is a sectional view showing one example of the configuration of a semiconductor device according to a first embodiment.

FIG. 1 is a sectional view showing one example of the configuration of a semiconductor device 1 according to a first embodiment. The semiconductor device 1 includes a stacked body S1, a columnar electrode 30, a semiconductor chip 40, a bonding layer 50, a resin layer 70, a component 80, a re-distribution layer (RDL) (i.e., a substrate) 100, and a metal bump 150. The semiconductor device 1 may be a semiconductor package such as NAND flash memory or a large scale integration (LSI), for example.

The stacked body S1 includes a semiconductor chip 10 and a bonding layer 20. The bonding layer 20 is a die attachment film (DAF), for example. The stacked body S1 is provided on a lower surface of the re-distribution layer 100 shown in FIG. 1. Moreover, a stacking direction of the stacked body S1 is the direction of the normal to the re-distribution layer 100 (a Z direction).

A plurality of semiconductor chips 10 each have a first surface F10a and a second surface F10b on the side opposite to the first surface F10a. Semiconductor elements (which are not shown in FIG. 1) such as a memory cell array, a transistor, a capacitor and so forth are formed on the first surface F10a of each semiconductor chip 10. The semiconductor elements on the first surface F10a of the semiconductor chip 10 are protected by being covered with an unillustrated insulating film. An inorganic insulating material such as a silicon oxide film or a silicon nitride film, for example, is used for the insulating film. Moreover, a material obtained by forming an organic insulating material on an inorganic insulating material may be used for the insulating film. For example, resins such as phenolic resins, polyimide resins, polyamide resins, acrylic resins, epoxy resins, p-phenylenebenzobisoxazole (PBO) resins, silicone resins, and benzocyclobutene resins or organic insulating materials such as a mixed material obtained by mixing some of these resins and a composite material composed of some of these resins are used as the organic insulating material. The semiconductor chip 10 may be a memory chip of NAND flash memory or a semiconductor chip incorporating any LSI. The semiconductor chips 10 may be semiconductor chips having the same configuration, or the semiconductor chips 10 may be semiconductor chips having different configurations.

The semiconductor chips 10 are stacked and bonded by the bonding layers 20. For example, resins such as phenolic resins, polyimide resins, polyamide resins, acrylic resins, epoxy resins, p-phenylenebenzobisoxazole (PBO) resins, silicone resins, and benzocyclobutene resins or organic insulating materials such as a mixed material obtained by mixing some of these resins and a composite material composed of some of these resins are used as the bonding layers 20. The semiconductor chips 10 each include an electrode pad (which is not shown in FIG. 1) exposed on the first surface F10a. A semiconductor chip 10 (an upper semiconductor chip 10) which is stacked on another semiconductor chip 10 (a lower semiconductor chip 10) is stacked in such a way that the upper semiconductor chip 10 is displaced in a direction (an X direction) nearly perpendicular to a side on which the electrode pad of the lower semiconductor chip 10 is provided, so as not to overlap with the electrode pad of the lower semiconductor chip 10.

The electrode pad is electrically connected to any one of the semiconductor elements provided on the semiconductor chip 10. For example, one of materials such as Cu, Ni, W, Au, Ag, Pd, Sn, Bi, Zn, Cr, Al, Ti, Ta, TiN, TaN, and CrN, a composite film formed of two or more of these materials, or low-resistance metal such as an alloy of two or more of these materials is used as the electrode pad.

The columnar electrode 30 is connected to the electrode pad of the semiconductor chip 10 and extends in the stacking direction of the semiconductor chips 10 (the Z direction). A part of the bonding layer 20 is removed in such a way that a part of the electrode pad is exposed, which allows the columnar electrode 30 to be connected to the electrode pad. Alternatively, the bonding layer 20 is stuck to the second surface F10b of the upper semiconductor chip 10 and is provided not to overlap with the electrode pad of the lower semiconductor chip 10. A lower end of the columnar electrode 30 is connected to the electrode pad by wire bonding, for example. An upper end of the columnar electrode 30 reaches an upper surface of the resin layer 70 and is exposed at the upper surface. The upper end of the columnar electrode 30 is connected to an electrode pad of the re-distribution layer 100.

The semiconductor chip 40 has a first surface F40a and a second surface F40b on the side opposite to the first surface F40a. Semiconductor elements (which are not shown in FIG. 1) such as a transistor and a capacitor are formed on the first surface F40a of each semiconductor chip 40. The semiconductor elements on the first surface F40a of the semiconductor chip 40 are protected by being covered with an unillustrated insulating film. An inorganic insulating material such as a silicon oxide film or a silicon nitride film, for example, is used for the insulating film. Moreover, a material obtained by forming an organic insulating material on an inorganic insulating material may be used for the insulating film. For example, resins such as phenolic resins, polyimide resins, polyamide resins, acrylic resins, epoxy resins, p-phenylenebenzobisoxazole (PBO) resins, silicone resins, and benzocyclobutene resins or organic insulating materials such as a mixed material obtained by mixing some of these resins and a composite material composed of some of these resins are used as the organic insulating material. The semiconductor chip 40 may be, for example, a controller chip that controls the memory chip (the semiconductor chip 10), or a semiconductor chip incorporating any LSI.

The semiconductor chip 40 is stacked on the uppermost semiconductor chip 10 and is bonded to the uppermost semiconductor chip 10 by the bonding layer 50. The semiconductor chip 40 includes an electrode pad (which is not shown in FIG. 1) exposed on the first surface F40a. The electrode pad on the first surface F40a is electrically connected to an electrode pad (which is not shown in FIG. 1) of the re-distribution layer 100 via a connecting pillar 41. Conductive metal such as Cu, for example, may be used as a material for the connecting pillar 41.

The resin layer 70 covers (encapsulates) the stacked body S1, the semiconductor chip 40, and the columnar electrode 30, and the tips of the columnar electrode 30 and the connecting pillar 41 are exposed at the upper surface of the resin layer 70.

For example, resins such as phenolic resins, polyimide resins, polyamide resins, acrylic resins, epoxy resins, p-phenylenebenzobisoxazole (PBO) resins, silicone resins, and benzocyclobutene resins or organic insulating materials such as a mixed material obtained by mixing some of these resins and a composite material composed of some of these resins are used as the resin layer (mold) 70.

The component 80 is provided below the stacked body S1. A material for the component 80 is silicon (Si), for example. The component 80 may be an insulating film or the like. Moreover, no component 80 may be provided.

The re-distribution layer 100 is provided on the resin layer 70 and is electrically connected to the columnar electrode 30 and the connecting pillar 41. The re-distribution layer 100 is a multilayer interconnection layer in which a plurality of interconnection layers and a plurality of insulating layers are stacked, and electrically connects the semiconductor chip 10 to the metal bump 150 via the columnar electrode 30 and electrically connects the semiconductor chip 40 to the metal bump 150 via the connecting pillar 41. FIG. 1 schematically shows the interconnection layers in the re-distribution layer 100. The details of the configuration of the re-distribution layer 100 will be described later with reference to FIGS. 2A to 3B.

Moreover, the semiconductor chips 10 and 40 are provided on the re-distribution layer 100. Interconnections of the re-distribution layer 100 include a feed system interconnection that supplies power to the semiconductor chips 10 and 40 and a signal interconnection that supplies a signal to the semiconductor chips 10 and 40.

The metal bump 150 is provided on the re-distribution layer 100 and is electrically connected to the interconnection layers of the re-distribution layer 100. The metal bump 150 is used for connection with an external device (which is not shown in FIG. 1). For example, one of materials such as Sn, Ag, Cu, Au, Pd, Bi, Zn, Ni, Sb, In, and Ge, a composite film formed of two or more of these materials, or an alloy of two or more of these materials is used as the metal bump 150.

Next, the internal configuration of the re-distribution layer 100 will be described.

Figure 2A:
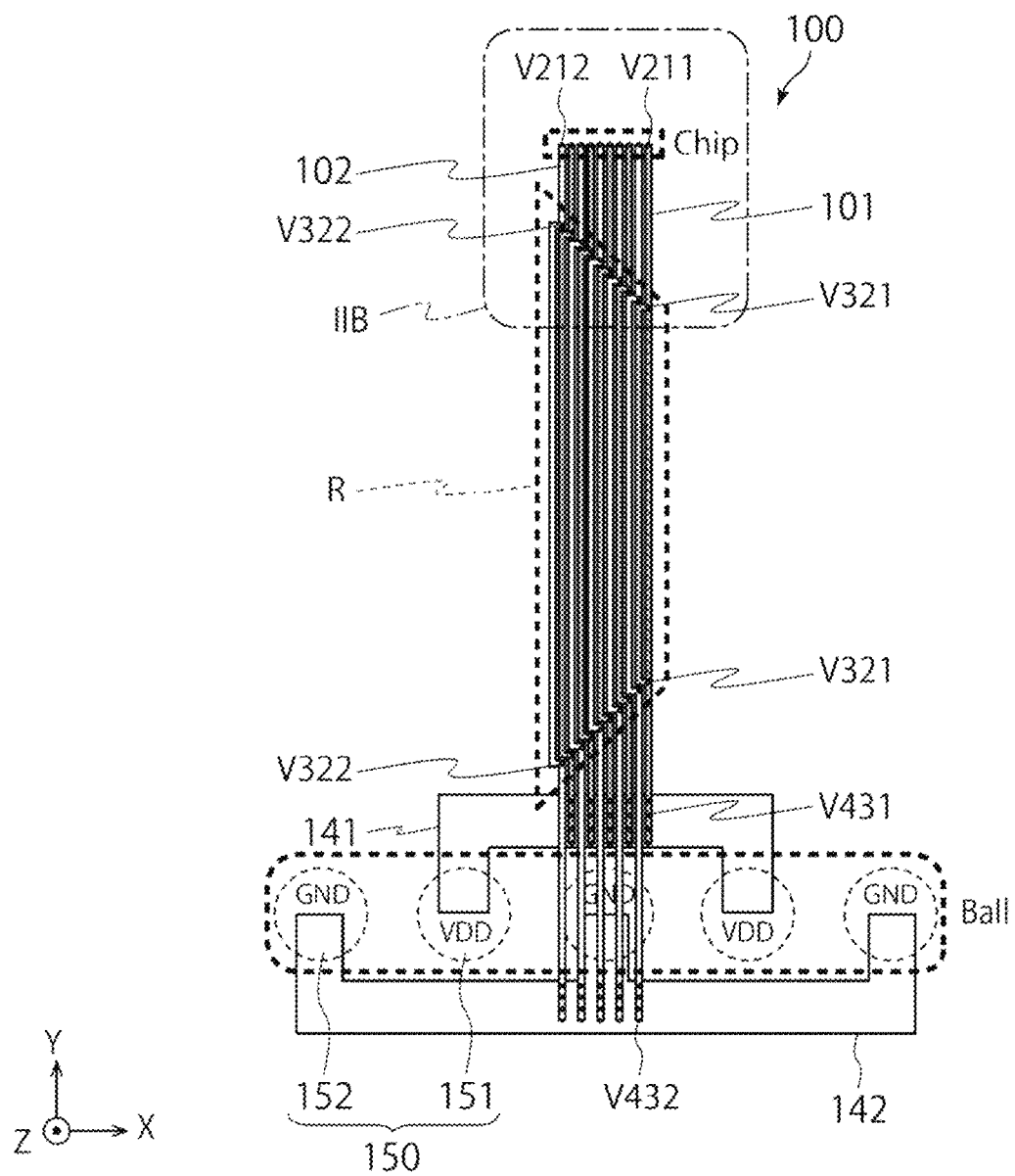
FIG. 2A is a diagram showing one example of the configuration of a re-distribution layer according to the first embodiment.
Figure 2B:
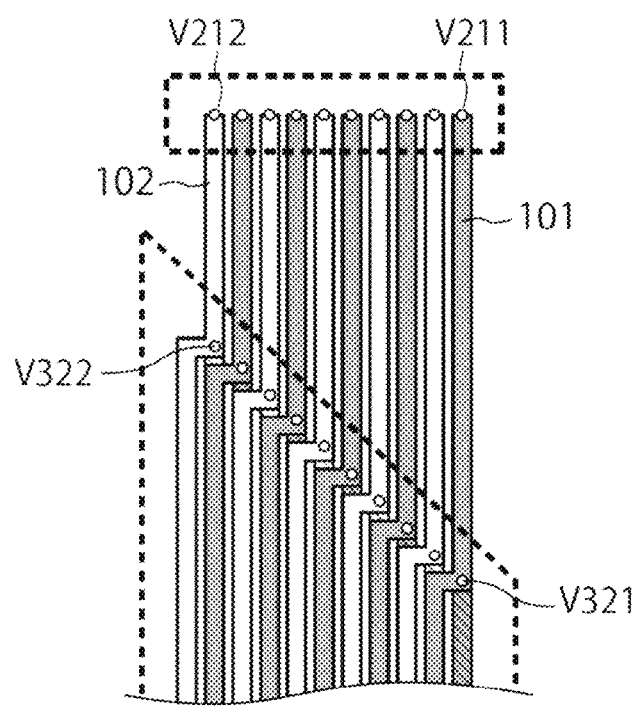
FIG. 2B is an enlarged view of columnar electrodes shown in FIG. 2A and surrounding areas thereof.

FIG. 2A is a diagram showing one example of the configuration of the re-distribution layer 100 according to the first embodiment. FIG. 2A is a top view of the re-distribution layer 100 viewed from the Z direction of FIG. 1. FIG. 2B is an enlarged view of columnar electrodes V321 and V322 shown in FIG. 2A and surrounding areas thereof.

Figure 3A:
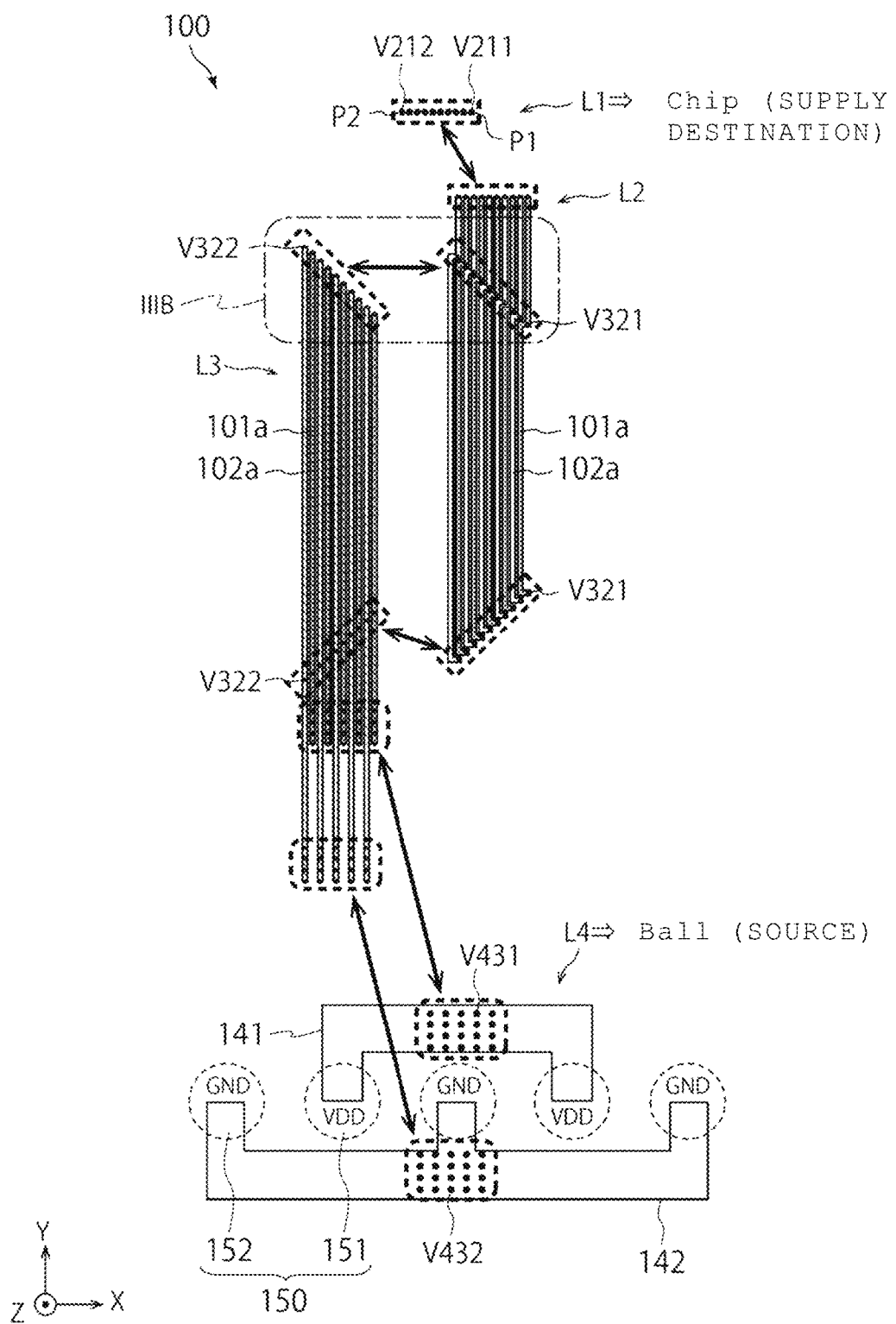
FIG. 3A is a diagram showing one example of the configuration of the re-distribution layer according to the first embodiment.
Figure 3B:
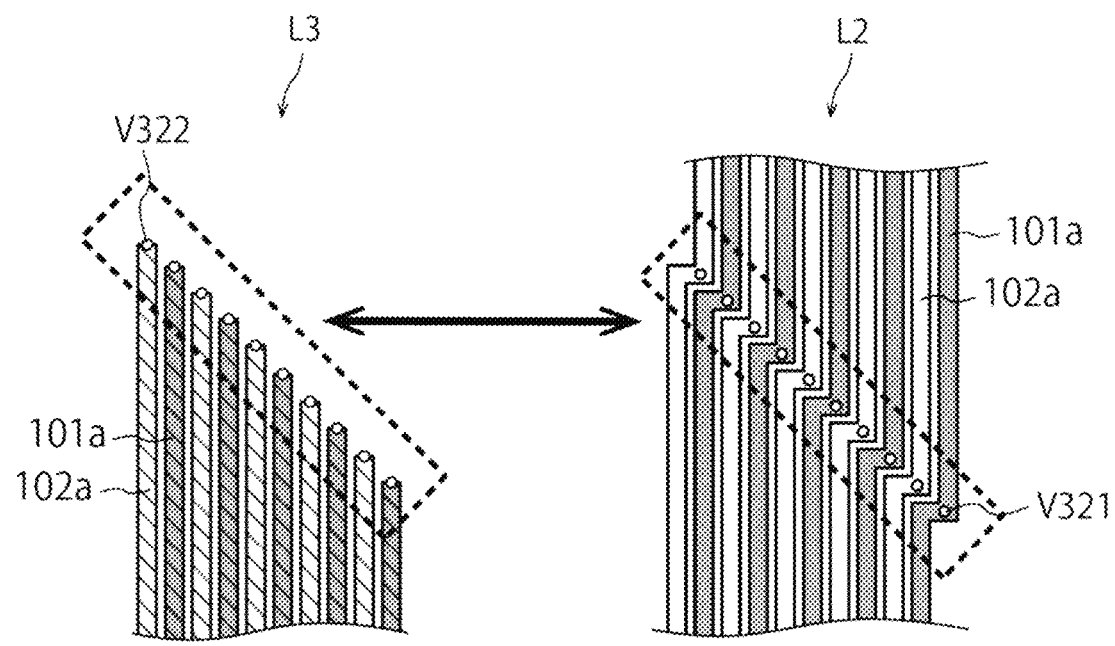
FIG. 3B is an enlarged view of the columnar electrodes shown in FIG. 3A and surrounding areas thereof.

FIG. 3A is a diagram showing one example of the configuration of the re-distribution layer 100 according to the first embodiment. FIG. 3A shows the configuration of each interconnection layer in the re-distribution layer 100 shown in FIG. 2A. FIG. 3B is an enlarged view of columnar electrodes V321 and V322 shown in FIG. 3A and surrounding areas thereof.

The insulating layers in the re-distribution layer 100 are not shown in FIGS. 2A to 3B.

The re-distribution layer 100 includes an interconnection 101, an interconnection 102, and interconnection layers L1, L2, L3, and L4. The interconnection layer L2 is shown in front of the interconnection layer L3 in FIGS. 2A and 2B.

The interconnection 101 is an interconnection that supplies a first reference voltage to the semiconductor chips 10 and 40. The first reference voltage is a power supply voltage VDD, for example. The interconnection 101 electrically connects between the metal bump 150 which is a source and the semiconductor chips 10 and 40 which are supply destinations.

The interconnection 102 is an interconnection that supplies a second reference voltage, which is different from the first reference voltage, to the semiconductor chips 10 and 40. The second reference voltage is a ground voltage GND, for example. The interconnection 102 electrically connects between the metal bump 150 which is a source and the semiconductor chips 10 and 40 which are supply destinations.

The interconnection layers L1, L2, L3, and L4 are stacked in the Z direction (i.e., a second direction) which is the stacking direction. For example, the signal interconnection is mainly provided in the interconnection layers L1 and L4. For example, the interconnection 101 which is a power supply interconnection and the interconnection 102 which is a ground interconnection are mainly provided in the interconnection layers L2 and L3. Moreover, the metal bump 150 is provided in the interconnection layer L4. Pads P1 and P2 for connection with the columnar electrode 30 and the connecting pillar 41 are provided in the interconnection layer L1.

The metal bump 150 includes a metal bump 151 and a metal bump 152. The metal bump 151 is electrically connected to an end of the interconnection 101. The metal bump 152 is electrically connected to an end of the interconnection 102.

Next, the internal configuration of the interconnection 101 will be described.

The interconnection 101 includes an interconnection 141, an interconnection component 101a, columnar electrodes V211, V321, and V431, and the pad P1.

The interconnection 141 is provided in the interconnection layer L4 and electrically connects the metal bump 151 and the columnar electrode V431. The interconnection 141 is provided at one end of the interconnection 101 and functions as an input end through which the first reference voltage is input to the re-distribution layer 100.

The columnar electrode V431 extends in the Z direction. The columnar electrode V431 electrically connects the interconnection 141 in the interconnection layer L4 and the interconnection component 101a in the interconnection layer L3.

The columnar electrodes V431 are provided in accordance with the number of interconnection components 101a in one interconnection layer. In the example shown in FIGS. 2A to 3B, 4×5 columnar electrodes V431 are provided.

The interconnection component 101a is provided in the interconnection layers L2 and L3 and electrically connects the columnar electrode V431 and the columnar electrode V211 via the columnar electrode V321. A plurality of interconnection components 101a are provided in one interconnection layer. For example, four or more interconnection components 101a are provided in one interconnection layer. In the example shown in FIGS. 2A to 3B, five interconnection components 101a are provided in each of the interconnection layer L2 and the interconnection layer L3. Moreover, in FIGS. 2A to 3B, the interconnection components 101a in the interconnection layer L3 are hatched.

Furthermore, the interconnection components 101a make a path of the interconnection 101 branch into a plurality of paths. That is, the interconnection components 101a are provided in a comb-shaped arrangement.

The columnar electrode V321 extends in the Z direction. The columnar electrode V321 electrically connects the interconnection component 101a in the interconnection layer L3 (i.e., a first interconnection layer) and the interconnection component 101a in the interconnection layer L2 (i.e., a second interconnection layer) which is stacked on the interconnection layer L3.

The columnar electrodes V321 are provided in accordance with the number of interconnection components 101a in one interconnection layer. In the example shown in FIGS. 2A to 3B, five columnar electrodes V321 are provided on the side where the columnar electrodes V431 are located and five columnar electrodes V321 are provided on the side where the columnar electrodes V211 are located.

Each interconnection component 101a branches into an interconnection component 101a in the interconnection layer L2 and an interconnection component 101a in the interconnection layer L3 in a region R between the columnar electrodes V321 on the side where the columnar electrodes V431 are located and the columnar electrodes V321 on the side where the columnar electrodes V211 are located.

The columnar electrode V211 extends in the Z direction. The columnar electrode V211 electrically connects the interconnection component 101a in the interconnection layer L2 and the pad P1 in the interconnection layer L1.

The columnar electrodes V211 are provided in accordance with the number of interconnection components 101a in one interconnection layer. In the example shown in FIGS. 2A to 3B, five columnar electrodes V211 are provided.

The pad P1 is provided in the interconnection layer L1. The pad P1 is provided at the other end of the interconnection 101 and functions as an output end through which the first reference voltage is output from the re-distribution layer 100. The first reference voltage that is output from the pad P1 is input to the semiconductor chips 10 and 40.

Next, the internal configuration of the interconnection 102 will be described.

The interconnection 102 includes an interconnection 142, an interconnection component 102a, columnar electrodes V212, V322, and V432, and the pad P2.

The interconnection 142 is provided in the interconnection layer L4 and electrically connects the metal bump 152 and the columnar electrode V432. The interconnection 142 is provided at one end of the interconnection 102 and functions as an input end through which the second reference voltage is input to the re-distribution layer 100.

The columnar electrode V432 extends in the Z direction. The columnar electrode V432 electrically connects the interconnection 142 in the interconnection layer L4 and the interconnection component 102a in the interconnection layer L3.

The columnar electrodes V432 are provided in accordance with the number of interconnection components 102a in one interconnection layer. In the example shown in FIGS. 2A to 3B, 4×5 columnar electrodes V432 are provided.

The interconnection component 102a is provided in the interconnection layers L2 and L3 and electrically connects the columnar electrode V432 and the columnar electrode V212 via the columnar electrode V322. A plurality of interconnection components 102a are provided in one interconnection layer. For example, four or more interconnection components 102a are provided in one interconnection layer. In the example shown in FIGS. 2A to 3B, five interconnection components 102a are provided in each of the interconnection layer L2 and the interconnection layer L3. Moreover, in FIGS. 2A to 3B, the interconnection components 102a in the interconnection layer L3 are hatched.

Furthermore, the interconnection components 102a make a path of the interconnection 102 branch into a plurality of paths. That is, the interconnection components 102a are provided in a comb-shaped arrangement.

The columnar electrode V322 extends in the Z direction. The columnar electrode V322 electrically connects the interconnection component 102a in the interconnection layer L3 (i.e., the first interconnection layer) and the interconnection component 102a in the interconnection layer L2 (i.e., the second interconnection layer) which is stacked on the interconnection layer L3.

The columnar electrodes V322 are provided in accordance with the number of interconnection components 102a in one interconnection layer. In the example shown in FIGS. 2A to 3B, five columnar electrodes V322 are provided on the side where the columnar electrodes V432 are located and five columnar electrodes V322 are provided on the side where the columnar electrodes V212 are located.

Each interconnection component 102a branches into an interconnection component 102a in the interconnection layer L2 and an interconnection component 102a in the interconnection layer L3 in the region R between the columnar electrodes V322 on the side where the columnar electrodes V432 are located and the columnar electrodes V322 on the side where the columnar electrodes V212 are located.

The columnar electrode V212 extends in the Z direction. The columnar electrode V212 electrically connects the interconnection component 102a in the interconnection layer L2 and the pad P2 in the interconnection layer L1.

The columnar electrodes V212 are provided in accordance with the number of interconnection components 102a in one interconnection layer. In the example shown in FIGS. 2A to 3B, five columnar electrodes V212 are provided.

The pad P2 is provided in the interconnection layer L1. The pad P2 is provided at the other end of the interconnection 102 and functions as an output end through which the second reference voltage is output from the re-distribution layer 100. The second reference voltage that is output from the pad P2 is input to the semiconductor chips 10 and 40.

Next, the placement relationship between the interconnection components 101a and the interconnection components 102a will be described.

Figure 4:
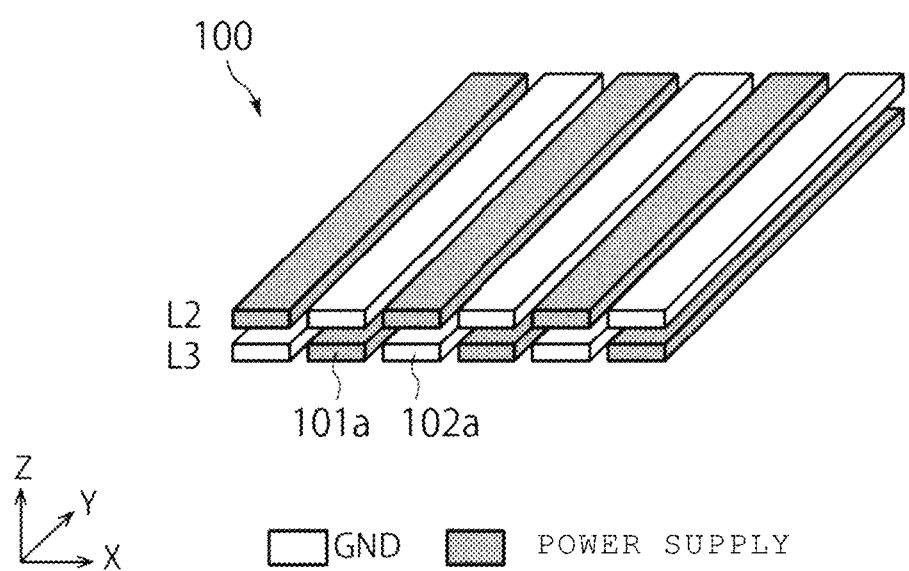
FIG. 4 is a perspective view showing one example of the configuration of the re-distribution layer according to the first embodiment.

FIG. 4 is a perspective view showing one example of the configuration of the re-distribution layer 100 according to the first embodiment. FIG. 4 shows the interconnection components 101a and 102a in the region R shown in FIG. 2A.

As shown in FIG. 4, the interconnection components 101a and 102a extending in a Y direction are placed so as to be alternately arranged in the X direction and placed so as to be alternately arranged in the Z direction.

As shown in FIG. 4, the interconnection components 101a and the interconnection components 102a are placed in the interconnection layers L2 and L3 so as to be alternately arranged in the X direction (i.e., a first direction) parallel to the interconnection layers L2 and L3. That is, the interconnection components 101a and 102a placed in a comb-shaped arrangement are alternately placed. Moreover, the interconnection components 101a and 102a are placed in such a way that a power supply interconnection and a ground interconnection, which are adjacent to each other, make a pair. The interconnection components 101a and 102a, which are insulated from each other by an unillustrated insulator placed therebetween, are placed so as to be adjacent to each other.

The interconnection components 101a and the interconnection components 102a are placed in the interconnection layers L2 and L3 so as to be alternately arranged in the X direction in such a way that they are electromagnetically coupled in the X direction. As a result, as will be described later with reference to FIGS. 5 and 6, electromagnetic coupling in the interconnection layer is obtained. This makes it possible to decrease the impedance of the feed system interconnection.

The interconnection components 101a and the interconnection components 102a are placed so as to be alternately arranged in the Z direction (i.e., the second direction) in such a way that they are electromagnetically coupled in the Z direction. Moreover, the interconnection components 101a and the interconnection components 102a are placed so as to overlap when viewed from the Z direction. As a result, as will be described later with reference to FIGS. 5 and 6, electromagnetic coupling between the interconnection layers is obtained. This makes it possible to decrease the impedance of the feed system interconnection.

The interconnection components 101a and 102a in the interconnection layer L2 are placed so as to be displaced in the X direction by one column as compared with the interconnection components 101a and 102a in the interconnection layer L3. That is, when viewed from the Z direction, the interconnection component 101a in the interconnection layer L3 (i.e., the first interconnection layer) and the interconnection component 101a in the interconnection layer L2 (i.e., the second interconnection layer) which are electrically connected by the columnar electrode V321 are placed so as to be displaced from each other in the X direction by the distance between the interconnection component 101a and the interconnection component 102a, which are adjacent to each other in the same interconnection layer, in the X direction. Moreover, when viewed from the Z direction, the interconnection component 102a in the interconnection layer L3 (i.e., the first interconnection layer) and the interconnection component 102a in the interconnection layer L2 (i.e., the second interconnection layer) which are electrically connected by the columnar electrode V322 are placed so as to be displaced from each other in the X direction by the distance between the interconnection component 101a and the interconnection component 102a, which are adjacent to each other in the same interconnection layer, in the X direction.

The interconnection components 101a and the interconnection components 102a in the interconnection layer L3 (i.e., the first interconnection layer) are placed so as to extend almost linearly in the Y direction (i.e., a third direction) perpendicular to both the X direction and the Z direction. When viewed from the Z direction, the interconnection components 101a and the interconnection components 102a in the interconnection layer L2 (i.e., the second interconnection layer) are placed so as to protrude in the X direction (a −X direction in the example shown in FIG. 3A). This makes it possible to form each interconnection component in one layer so as to have a convex shape and thereby displace an interconnection component in the interconnection layer L2 and an interconnection component in the interconnection layer L3, into which an interconnection component is made to branch, from each other in the X direction. The interconnection components 101a and the interconnection components 102a in the interconnection layer L2 may be placed so as to extend almost linearly in the Y direction (i.e., the third direction). In this case, when viewed from the Z direction, the interconnection components 101a and the interconnection components 102a in the interconnection layer L3 are placed so as to protrude in the X direction (the −X direction in the example shown in FIG. 3A).

When viewed from the Z direction, the columnar electrode V321 and the columnar electrode V322 corresponding to the interconnection component 101a and the interconnection component 102a, respectively, which are adjacent to each other in the same interconnection layer are placed in such a way that the positions thereof in the Y direction (i.e., the third direction) perpendicular to both the X direction and the Z direction are displaced from each other. The adjacent columnar electrodes V321 and V322 are displaced in the Y direction, which makes it possible to place the interconnection components 101a and 102a in the interconnection layer L2 so as to be displaced in the X direction without interference between the adjacent interconnection components 101a and 102a.

Moreover, when viewed from the Z direction, the columnar electrodes V321 and the columnar electrodes V322 are placed so as to be alternately arranged in an oblique direction with respect to both the X direction and the Y direction. In the example shown in FIG. 3A, the columnar electrodes V321 and V322 on the side where the columnar electrodes V211 and V212 are located from upper left to lower right. The columnar electrodes V321 and V322 on the side where the columnar electrodes V431 and V432 are located are placed from lower left to upper right. That is, the columnar electrodes V321 and V322 are placed roughly in the shape of the letter V. In the interconnection layer L2, the convex portions of the interconnection components 101a and 102a in the −X direction are wider than those of the interconnection components 101a and 102a in the X direction. This makes it possible to place the interconnection components 101a and 102a in the interconnection layer L2 so as to be displaced in the X direction without interference between the adjacent interconnection components 101a and 102a.

Figure 5:
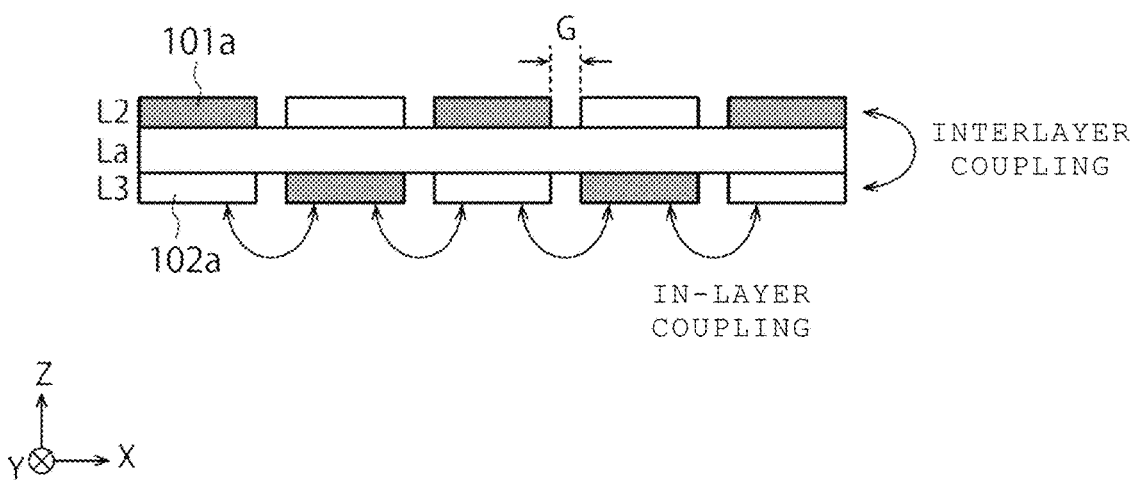
FIG. 5 is a diagram showing one example of the configuration of the re-distribution layer according to the first embodiment.

FIG. 5 is a diagram showing one example of the configuration of the re-distribution layer 100 according to the first embodiment. FIG. 5 is a diagram of the interconnection components 101a and 102a of FIG. 4 viewed from the Y direction. An insulating layer La between the interconnection layer L2 and the interconnection layer L3 is also shown in FIG. 5.

By placing the interconnection components 101a and 102a as shown in FIG. 4, it is possible to electromagnetically couple the interconnection component 101a and the interconnection component 102a between the interconnection layer L2 and the interconnection layer L3. Moreover, it is possible to electromagnetically couple the interconnection component 101a and the interconnection component 102a in the interconnection layer L2. Furthermore, it is possible to electromagnetically couple the interconnection component 101a and the interconnection component 102a in the interconnection layer L3. Interlayer electromagnetic coupling and in-layer electromagnetic coupling make it possible to increase a coupling coefficient. An increase in the coupling coefficient makes it possible to reduce inductance and lower the impedance (source impedance) of the feed system interconnection.

The interconnection components 101a and 102a in the same interconnection layer are placed with an interconnection gap G left therebetween. The coupling coefficient between the interconnection component 101a and the interconnection component 102a varies depending on the interconnection gap G.

Figure 6:
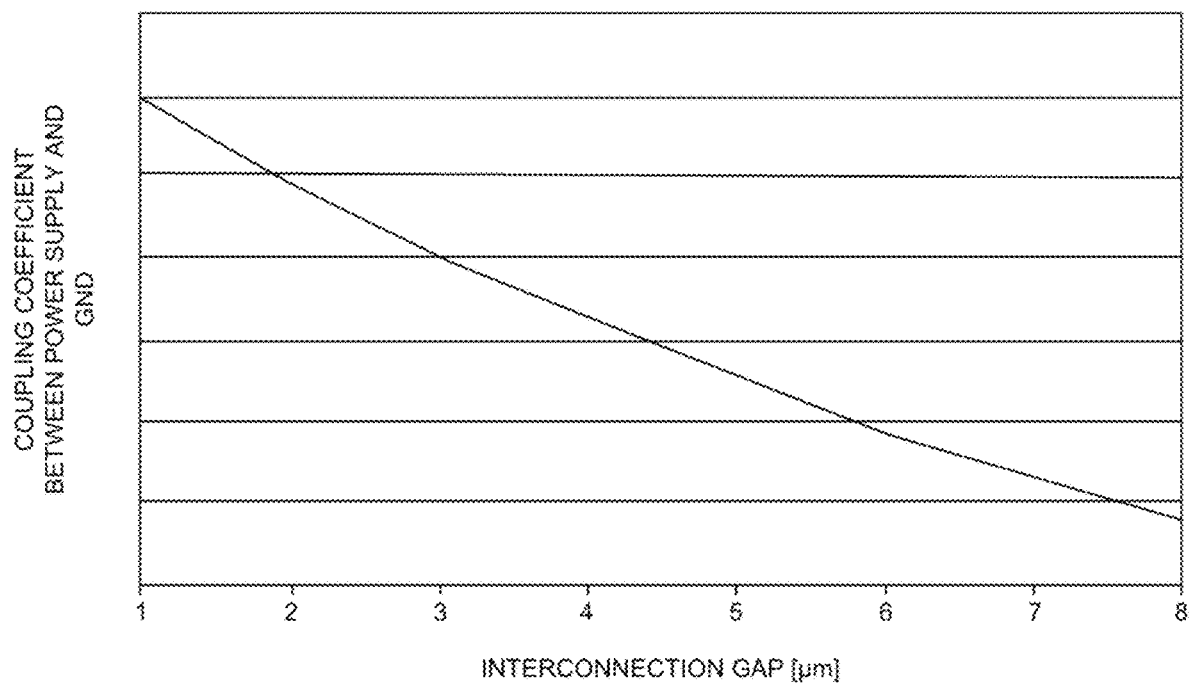
FIG. 6 is a diagram showing the relationship between an interconnection gap and a coupling coefficient according to the first embodiment.

FIG. 6 is a diagram showing the relationship between the interconnection gap G and the coupling coefficient according to the first embodiment. The horizontal axis of a graph of FIG. 6 represents the interconnection gap G. The vertical axis of the graph of FIG. 6 represents the coupling coefficient. FIG. 6 shows the results of a simulation.

As shown in FIG. 6, the smaller the interconnection gap G, the higher the coupling coefficient. As a result, it is possible to lower the impedance of the feed system interconnection. Since a wiring substrate is the re-distribution layer 100, it is possible to form the interconnection components 101a and 102a by photolithography or the like in such a way as to narrow the interconnection gap G. The interconnection gap G is about 2 μm, for example.

As described above, according to the first embodiment, the interconnection components 101a and the interconnection components 102a are placed in the interconnection layers L2 and L3 so as to be alternately arranged in the X direction. This makes it possible to decrease the impedance of the feed system interconnection by electromagnetic coupling in the interconnection layers.

The wiring substrate is not limited to the re-distribution layer 100; a wiring substrate that can make the interconnection gap G smaller may be used in place of the re-distribution layer 100.

Next, a case where in-layer electromagnetic coupling is not used will be described as a comparative example.

Figure 7:
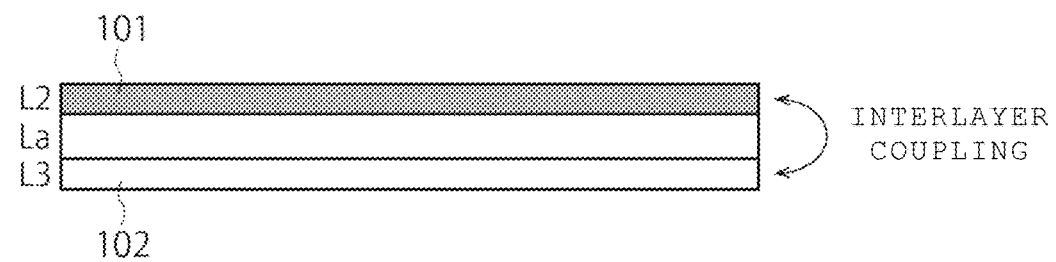
FIG. 7 is a diagram showing one example of the configuration of a re-distribution layer according to a comparative example.
Figure 7:
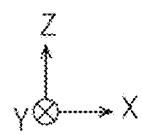

FIG. 7 is a diagram showing one example of the configuration of a re-distribution layer 100 according to the comparative example.

In the comparative example, an interconnection 101 is placed in the shape of a sheet (a plane arrangement) in an interconnection layer L2 and an interconnection 102 is placed in the shape of a sheet in an interconnection layer L3. In this case, interlayer electromagnetic coupling is obtained between the interconnection 101 and the interconnection 102.

Figure 8:
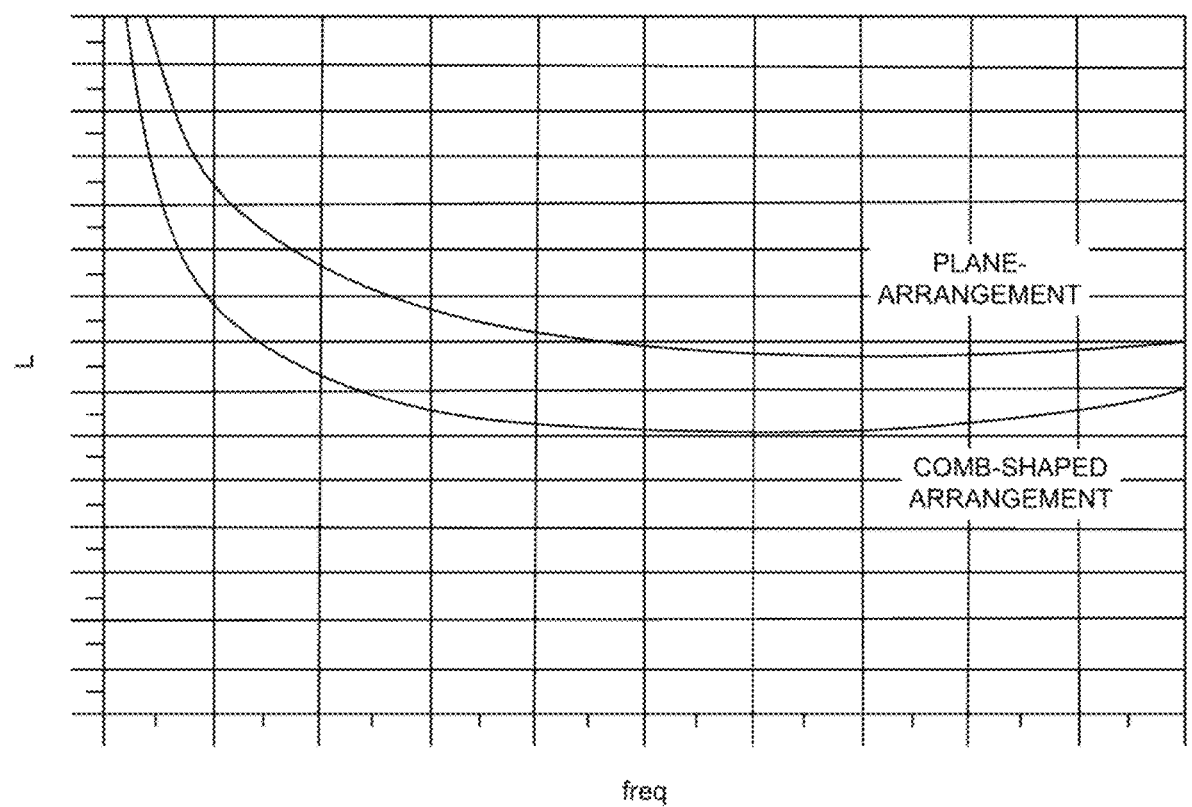
FIG. 8 is a diagram showing the relationship between the frequency and inductance.

FIG. 8 is a diagram showing the relationship between the frequency and inductance. The horizontal axis of a graph of FIG. 8 represents the frequency. The vertical axis of the graph of FIG. 8 represents inductance (L). FIG. 8 shows the results of a simulation. FIG. 8 shows an inductance's frequency dependency comparison between the first embodiment (the comb-shaped arrangement) and the comparative example (the plane arrangement).

In all the frequency bands shown in FIG. 8, the inductance of the interconnection components 101a and 102a in the comb-shaped arrangement is lower than the inductance of the interconnections 101 and 102 in the plane arrangement. Moreover, even in a high-frequency band of 1 GHz or higher, the inductance of the interconnection components 101a and 102a in the comb-shaped arrangement is lower than the inductance of the interconnections 101 and 102 in the plane arrangement.

In the first embodiment, in comparison with the comparative example shown in FIG. 7, interlayer electromagnetic coupling becomes weak by an interconnection area corresponding to the interconnection gap G shown in FIG. 5; however, the use of in-layer electromagnetic coupling makes it possible to increase a coupling coefficient. This makes it possible to reduce inductance as shown in FIG. 8. The larger the interconnection gap G, the weaker both in-layer and interlayer electromagnetic coupling. When the interconnection gap G is about 5 μm or less, for example, a coupling coefficient higher than that of the comparative example is obtained. Moreover, the interconnection gap G may be set such that, for example, a coupling coefficient or inductance more than or equal to a predetermined value is obtained.

Furthermore, in the comparative example, by increasing the area of the interconnections 101 and 102 in an XY in-plane direction, it is possible to decrease inductance and decrease the impedance of the feed system interconnection. In this case, however, a necessary interconnection area is increased. Moreover, it is also possible to decrease the impedance of the feed system interconnection by increasing the number of stacked layers or incorporating a capacitor. In this case, however, the number of necessary layers is increased or costs are increased.

By contrast, in the first embodiment, as shown in FIG. 8, it is possible to make lower the impedance of the feed system interconnection with almost the same interconnection region (area) as that of the interconnections 101 and 102 in the plane arrangement. Moreover, it is possible to lower the impedance of the feed system interconnection while curbing an increase in the number of necessary layers and an increase in cost.

First Modification of the First Embodiment

Figure 9:
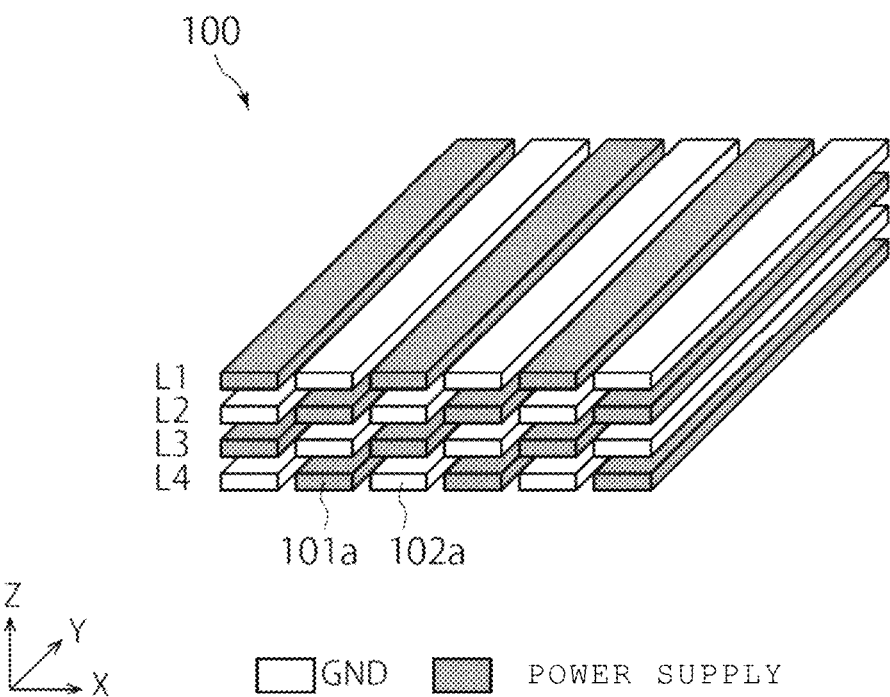
FIG. 9 is a perspective view showing one example of the configuration of a re-distribution layer according to a first modification of the first embodiment.

FIG. 9 is a perspective view showing one example of the configuration of a re-distribution layer 100 according to a first modification of the first embodiment. The first modification of the first embodiment differs from the first embodiment in that interconnection components 101a and 102a are provided in all of the interconnection layers L1, L2, L3, and L4.

In an example shown in FIG. 9, four layers of interconnection components 101a and interconnection components 102a are provided and the interconnection components 101a and the interconnection components 102a are placed so as to be alternately arranged in the Z direction. For example, the interconnection components 101a and 102a in the interconnection layer L3 shown in FIG. 3A are also provided in the interconnection layer L1. Moreover, the interconnection components 101a and 102a in the interconnection layer L2 shown in FIG. 3A are also provided in the interconnection layer L4. Furthermore, the columnar electrodes V321 and V322 shown in FIG. 3A extend from the interconnection layer L1 to the interconnection layer L4.

The number of stacked layers of the interconnection components 101a and 102a in the Z direction may be increased as in the first modification of the first embodiment to achieve stronger interlayer electromagnetic coupling.

A semiconductor device 1 according to the first modification of the first embodiment can obtain effects similar to those of the first embodiment.

Second Modification of the First Embodiment

Figure 10:
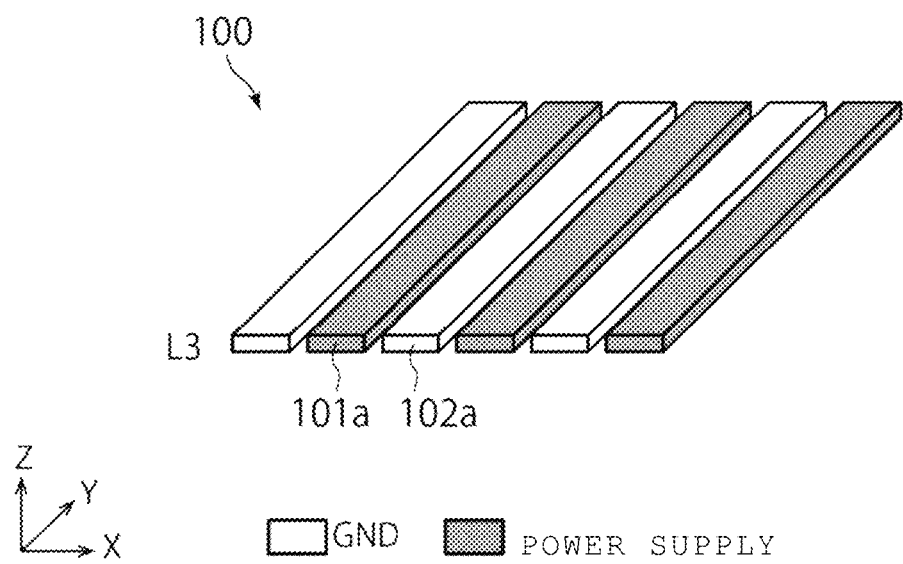
FIG. 10 is a perspective view showing one example of the configuration of a re-distribution layer according to a second modification of the first embodiment.

FIG. 10 is a perspective view showing one example of the configuration of a re-distribution layer 100 according to a second modification of the first embodiment. The second modification of the first embodiment differs from the first embodiment in that interconnection components 101a and 102a are provided in one interconnection layer.

The re-distribution layer 100 includes at least one interconnection layer. In an example shown in FIG. 10, a plurality of interconnection components 101a and a plurality of interconnection components 102a are provided in an interconnection layer L3 which is one interconnection layer. For example, an interconnection component 101a between two columnar electrodes V321 in the interconnection layer L2 shown in FIG. 3A is not provided. An interconnection component 102a between two columnar electrodes V322 in the interconnection layer L2 shown in FIG. 3A is not provided. The interconnection components 101a and the interconnection components 102a may be provided in the interconnection layer L2.

The interconnection components 101a and 102a may be provided in one interconnection layer as in the second modification of the first embodiment.

A semiconductor device 1 according to the second modification of the first embodiment can obtain effects similar to those of the first embodiment.

Second Embodiment

Figure 11:
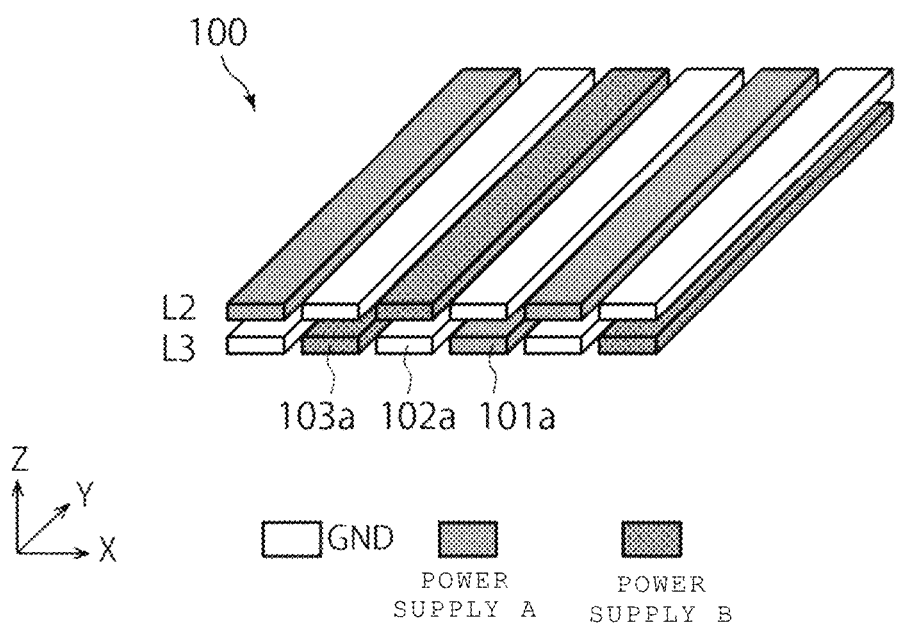
FIG. 11 is a perspective view showing one example of the configuration of a re-distribution layer according to a second embodiment.

FIG. 11 is a perspective view showing one example of the configuration of a re-distribution layer 100 according to a second embodiment. The second embodiment differs from the first embodiment in part of a power supply voltage of an interconnection component 101a.

The re-distribution layer 100 further includes an interconnection 103.

The interconnection 103 is an interconnection that supplies a third reference voltage, which is different from the first reference voltage and the second reference voltage, to semiconductor chips 10 and 40. The third reference voltage is a power supply voltage, for example. In an example shown in FIG. 11, the first reference voltage which is supplied by the interconnection component 101a is a voltage of a power supply A. The third reference voltage which is supplied by an interconnection component 103a is a voltage of a power supply B different from the power supply A.

An interconnection 101 and the interconnection 103 are used for, for example, a power supply for operating logic circuits in the semiconductor chips 10 and 40 and an input/output (IO) power supply, respectively. Moreover, the interconnection 101 and the interconnection 103 may be used for, for example, an analog-specific power supply and a digital-specific power supply, respectively.

The interconnection 103 includes the interconnection component 103a.

The interconnection component 103a is provided in interconnection layers L2 and L3. A plurality of interconnection components 103a are provided in one interconnection layer.

Moreover, the interconnection components 103a make a path of the interconnection 103 branch into a plurality of paths. That is, the interconnection components 103a are provided in a comb-shaped arrangement.

Furthermore, the interconnection components 101a or the interconnection components 103a and interconnection components 102a are placed in the interconnection layers L2 and L3 so as to be alternately arranged in the X direction. That is, when compared with the first embodiment shown in FIG. 4, some of the interconnection components 101a are replaced with the interconnection components 103a. It is preferable that the interconnection component 103a is placed so as to be sandwiched between the interconnection components 102a, not between the interconnection components 101a, in such a way that the interconnection component 103a is adjacent to the interconnection components 102a. The reason is that in-layer electromagnetic coupling becomes weak when the interconnection component 101a and the interconnection component 103a are placed so as to be adjacent to each other.

An interconnection component that supplies a voltage of a different power supply may be provided as in the second embodiment.

A semiconductor device 1 according to the second embodiment can obtain effects similar to those of the first embodiment.

Third Embodiment

Figure 12:
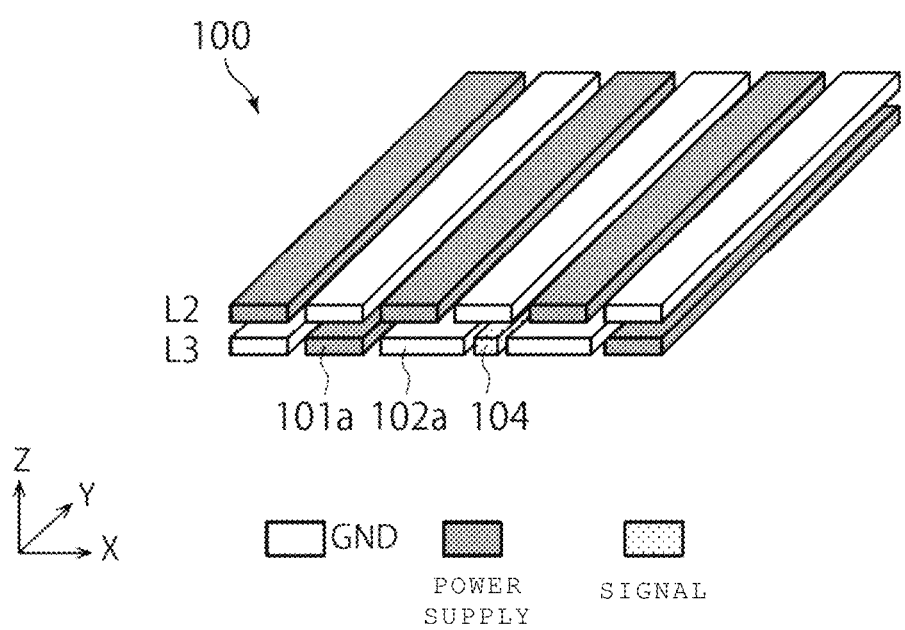
FIG. 12 is a perspective view showing one example of the configuration of a re-distribution layer according to a third embodiment.

FIG. 12 is a perspective view showing one example of the configuration of a re-distribution layer 100 according to a third embodiment. The third embodiment differs from the first embodiment in that a signal interconnection is provided in an interconnection layer L3.

The re-distribution layer 100 further includes a signal interconnection 104.

The signal interconnection 104 supplies a signal. More specifically, the signal interconnection 104 supplies a signal for operating semiconductor chips 10 and 40. In an example shown in FIG. 12, the signal interconnection 104 is provided in the interconnection layer L3. The signal interconnection 104 may be provided in an interconnection layer L2.

The signal interconnections 104 are placed in the interconnection layer L3 so as to be arranged in the X direction in such a way that the signal interconnection 104 is sandwiched between two interconnection components 102a. That is, the interconnection component 102a, the signal interconnection 104, and the interconnection component 102a are placed so as to be arranged in this order in the X direction with an unillustrated insulator sandwiched therebetween. The signal interconnections 104 may be placed in the interconnection layer L3 so as to be arranged in the X direction in such a way that the signal interconnection 104 is sandwiched between two interconnection components 101a.

The signal interconnection 104 may be placed between the interconnection component 101a that supplies a power supply voltage and the interconnection component 102a that supplies a ground voltage. In this case, however, there is a possibility that electromagnetic coupling between the interconnection component 101a and the interconnection component 102a becomes weak. In terms of the strength of electromagnetic coupling, it is preferable that the signal interconnection 104 is placed between two interconnection components 102a or between two interconnection components 101a.

The signal interconnection 104 may be provided between two interconnection components 102a as in the third embodiment.

A semiconductor device 1 according to the third embodiment can obtain effects similar to those of the first embodiment. Moreover, the second embodiment may be combined with the semiconductor device 1 according to the third embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate comprising a first interconnection configured to provide a first reference voltage, a second interconnection configured to provide a second reference voltage different from the first reference voltage, and at least one interconnection layer,
wherein the first interconnection comprises a plurality of first interconnection components that are provided in the interconnection layer,
wherein the second interconnection comprises a plurality of second interconnection components that are provided in the interconnection layer,
wherein the plurality of first interconnection components and the plurality of second interconnection components are alternately arranged in a first direction parallel to the interconnection layer,
wherein, when viewed from a second direction perpendicular to the first direction, the first interconnection component in the first interconnection layer and the first interconnection component in the second interconnection layer, which are electrically connected by one of the plurality of first columnar electrodes, are displaced from each other in the first direction by a distance between the first interconnection component and the second interconnection component, which are adjacent to each other in the same interconnection layer, in the first direction, and
wherein, when viewed from the second direction, the second interconnection component in the first interconnection layer and the second interconnection component in the second interconnection layer, which are electrically connected by one of the plurality of second columnar electrodes, are displaced from each other in the first direction by a distance between the first interconnection component and the second interconnection component, which are adjacent to each other in the same interconnection layer, in the first direction.

2. The semiconductor device according to claim 1,
wherein the plurality of first interconnection components forms a path of the first interconnection as a plurality of first paths, and
wherein the plurality of second interconnection components forms a path of the second interconnection as a plurality of second paths.

3. The semiconductor device according to claim 1,
wherein the plurality of first interconnection components and the plurality of second interconnection components are alternately arranged in the first direction such that the first interconnection components and the second interconnection components are electromagnetically coupled in the first direction.

4. The semiconductor device according to claim 1,
wherein the substrate comprises a plurality of the interconnection layers stacked in the second direction, and
wherein the first interconnection components and the second interconnection components are alternately arranged in the second direction.

5. The semiconductor device according to claim 4,
wherein the first interconnection further comprises a plurality of first columnar electrodes that electrically connect the first interconnection components in a first interconnection layer and the first interconnection components in a second interconnection layer stacked on the first interconnection layer, and wherein the second interconnection further comprises a plurality of second columnar electrodes that electrically connect the second interconnection components in the first interconnection layer and the second interconnection components in the second interconnection layer.

6. The semiconductor device according to claim 5, wherein the first interconnection components in the first interconnection layer extend linearly in a third direction perpendicular to both the first direction and the second direction, wherein the first interconnection components in the second interconnection layer, which are electrically connected to the first interconnection components in the first interconnection layer by the first columnar electrodes, protrude in the first direction when viewed from the second direction, wherein the second interconnection components in the first interconnection layer extend linearly in the third direction, and wherein the second interconnection components in the second interconnection layer, which are electrically connected to the second interconnection components in the first interconnection layer by the second columnar electrodes, protrude in the first direction when viewed from the second direction.

7. The semiconductor device according to claim 5, wherein, when viewed from the second direction, one of the plurality of first columnar electrodes and one of the plurality of second columnar electrodes corresponding to the first interconnection component and the second interconnection component, respectively, which are adjacent to each other in the same interconnection layer are displaced from each other in a third direction perpendicular to both the first direction and the second direction.

8. The semiconductor device according to claim 7, wherein the plurality of first columnar electrodes and the plurality of second columnar electrodes are alternately arranged in an oblique direction with respect to both the first direction and the third direction when viewed from the second direction.

9. The semiconductor device according to claim 1, wherein the substrate further comprises:

a first input end provided at one end of the first interconnection, the first input end through which the first reference voltage is input to the substrate;

a first output end provided at the other end of the first interconnection, the first output end through which the first reference voltage is output from the substrate;

a second input end provided at one end of the second interconnection, the second input end through which the second reference voltage is input to the substrate; and a second output end provided at the other end of the second interconnection, the second output end through which the second reference voltage is output from the substrate.

10. The semiconductor device according to claim 9, further comprising:

a semiconductor chip provided on the substrate, wherein the first reference voltage that is output from the first output end and the second reference voltage that is output from the second output end are input to the semiconductor chip.

11. The semiconductor device according to claim 1, wherein the substrate further comprises a third interconnection configured to provide a third reference voltage different from the first reference voltage and the second reference voltage, wherein the third interconnection comprises a plurality of third interconnection components provided in the interconnection layer, and wherein the plurality of second interconnection components, together with the plurality of first interconnection components or the plurality of third interconnection components, are placed in the interconnection layer and alternately arranged in the first direction.

12. The semiconductor device according to claim 1, wherein the substrate further comprises a signal interconnection configured to provide a signal, and wherein the signal interconnections are placed in the interconnection layer and arranged in the first direction in such a way that the signal interconnection is interposed between two first interconnection components of the first interconnection components or between two second interconnection components of the second interconnection components.

13. The semiconductor device according to claim 1, wherein a gap between the first interconnection component and the second interconnection component in the interconnection layer is equal to or less than about 5 µm.

14. The semiconductor device according to claim 1, wherein the substrate is a re-distribution layer.

* * * * *